US010790800B2

United States Patent
Hirota et al.

(10) Patent No.: US 10,790,800 B2
(45) Date of Patent: Sep. 29, 2020

(54) RESONATOR AND RESONANCE DEVICE

(71) Applicant: Murata Manufacturing Co., Ltd., Nagaokakyo-shi, Kyoto-fu (JP)

(72) Inventors: Wakana Hirota, Nagaokakyo (JP); Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 470 days.

(21) Appl. No.: 15/725,436

(22) Filed: Oct. 5, 2017

(65) Prior Publication Data
US 2018/0048288 A1 Feb. 15, 2018

Related U.S. Application Data

(63) Continuation of application No. PCT/JP2016/062873, filed on Apr. 25, 2016.
(Continued)

(51) Int. Cl.
*H03H 9/21* (2006.01)
*H03H 9/24* (2006.01)
(Continued)

(52) U.S. Cl.
CPC ............. *H03H 9/24* (2013.01); *B06B 1/0603* (2013.01); *B06B 1/0607* (2013.01);
(Continued)

(58) Field of Classification Search
CPC ........ H03H 9/172; H03H 9/178; H03H 9/215; H03H 9/21; H03H 9/2468; H03H 9/2473;
(Continued)

(56) References Cited

U.S. PATENT DOCUMENTS

| 5,986,381 A | 11/1999 | Hoen et al. |
| 8,110,966 B2 * | 2/2012 | Iwai ..................... H03H 9/0595 310/344 |

(Continued)

FOREIGN PATENT DOCUMENTS

| JP | S54-58395 A | 5/1979 |
| JP | S56-85921 A | 7/1981 |

(Continued)

OTHER PUBLICATIONS

Written Opinion of the International Searching Authority issued in International Application No. PCT/JP2016/063115, dated Jul. 19, 2016.
(Continued)

*Primary Examiner* — J. San Martin
(74) *Attorney, Agent, or Firm* — Arent Fox LLP

(57) ABSTRACT

In a resonator is provided that suppresses a shift of a resonant frequency. The resonator includes a vibration portion that has a base with front and rear ends and multiple vibration arms with fixed ends connected to the front end of the base and that extend away from the front end. Moreover, the resonator includes a frame that at least partially surrounds the vibration portion and one or more holding arms provided between the vibration portion and the frame with first ends connected to the base and the second ends connected to a region of the frame at the front end side relative to the rear end of the base portion.

20 Claims, 15 Drawing Sheets

Related U.S. Application Data

(60) Provisional application No. 62/153,049, filed on Apr. 27, 2015.

(51) Int. Cl.
*H03H 9/10* (2006.01)
*H03H 9/05* (2006.01)
*H03H 3/007* (2006.01)
*B06B 1/06* (2006.01)
*H03H 9/205* (2006.01)
H03H 3/04 (2006.01)
H03H 9/02 (2006.01)

(52) U.S. Cl.
CPC ........ *H03H 3/0072* (2013.01); *H03H 3/0078* (2013.01); *H03H 9/0595* (2013.01); *H03H 9/1057* (2013.01); *H03H 9/205* (2013.01); *H03H 9/2489* (2013.01); *H03H 2003/0435* (2013.01); *H03H 2009/02511* (2013.01)

(58) Field of Classification Search
CPC ...... H03H 9/2484; H03H 9/24; H03H 9/1057; H03H 9/205; H03H 3/04; H03H 3/026; H03H 3/0492; B06B 1/0603; B06B 1/0607
See application file for complete search history.

(56) References Cited

U.S. PATENT DOCUMENTS

| | | | |
|---|---|---|---|
| 8,120,234 B2* | 2/2012 | Iwai | H03H 3/04 310/348 |
| 8,191,216 B2 | 6/2012 | Yamazaki et al. | |
| 8,227,958 B2 | 7/2012 | Inoue et al. | |
| 8,347,719 B2* | 1/2013 | Ichikawa | H03H 9/0595 29/25.35 |
| 8,415,863 B2 | 4/2013 | Yamazaki et al. | |
| 9,748,921 B2* | 8/2017 | Yamazaki | H03H 9/21 |
| 2008/0134781 A1 | 6/2008 | Noguchi et al. | |
| 2008/0290490 A1 | 11/2008 | Fujii et al. | |
| 2009/0174286 A1* | 7/2009 | Yoshimatsu | H03H 3/04 310/321 |
| 2009/0178260 A1 | 7/2009 | Yamazaki et al. | |
| 2010/0079040 A1 | 4/2010 | Iwai | |
| 2010/0133958 A1 | 6/2010 | Umeki et al. | |
| 2010/0156246 A1 | 6/2010 | Iwai | |
| 2010/0201221 A1 | 8/2010 | Inoue et al. | |
| 2012/0212109 A1 | 8/2012 | Yamazaki et al. | |
| 2013/0283910 A1 | 10/2013 | Nishizawa et al. | |
| 2013/0305824 A1 | 11/2013 | Nishizawa et al. | |
| 2014/0084752 A1 | 3/2014 | Miyasaka | |
| 2014/0290362 A1* | 10/2014 | Nakagawa | G01C 19/5607 73/504.16 |
| 2016/0197597 A1 | 7/2016 | Yamada et al. | |
| 2016/0290802 A1 | 10/2016 | Nakagawa | |
| 2017/0179926 A1 | 6/2017 | Hirota et al. | |

FOREIGN PATENT DOCUMENTS

| | | |
|---|---|---|
| JP | S56-85922 A | 7/1981 |
| JP | S58-111515 A | 7/1983 |
| JP | 2007-123683 A | 5/2007 |
| JP | 2009-089231 A | 4/2009 |
| JP | 2009-171118 A | 7/2009 |
| JP | 2010-187054 A | 8/2010 |
| JP | 2010-283804 A | 12/2010 |
| JP | 5071058 B2 | 11/2012 |
| JP | 2015-33087 A | 2/2015 |
| WO | WO 2015/041152 A1 | 3/2015 |

OTHER PUBLICATIONS

International Search Report issued in International Application No. PCT/JP2015/079755, dated Nov. 24, 2016.
International Search Report issued in International Application No. PCT/JP2016/062873, dated Jul. 12, 2016.
International Search Report issued in International Application No. PCT/JP2016/063115, dated Jul. 19, 2016.
Written Opinion of the International Searching Authority issued in International Application No. PCT/JP2015/079755, dated Nov. 24, 2016.
Written Opinion of the International Searching Authority issued in International Application No. PCT/JP2016/062873, dated Jul. 12, 2016.

* cited by examiner

RESONATOR AND RESONANCE DEVICE

CROSS REFERENCE TO RELATED APPLICATIONS

The present application is a continuation of PCT/JP2016/062873 filed Apr. 25, 2016, which claims priority to U.S. Patent Provisional Application No. 62/153,049, filed Apr. 27, 2015, the entire contents of each of which are incorporated herein by reference.

TECHNICAL FIELD

The present disclosure relates to a resonator and a resonance device in which a plurality of vibration arms vibrate in an out-of-plane bending vibration mode.

BACKGROUND

Conventional resonance devices using a MEMS (Micro Electro Mechanical Systems) technique have been used as timing devices, for example. These resonance device are mounted on a printed substrate that is incorporated in an electronic apparatus such as a smart phone. The resonance devices include a lower substrate, an upper substrate forming a cavity between it and the lower substrate, and a resonator arranged in the cavity between the lower substrate and the upper substrate.

For example, Patent Document 1 (identified below) discloses a resonator including a plurality of vibration arms. In the resonator, fixed ends of the vibration arms are connected to a front end of a base portion and a rear end of the base portion at the opposite side to the front end is connected to a support portion. The support portion is connected to, for example, a base interposed between the lower substrate and the upper substrate. In an example of FIG. 1 in Patent Document 1, the vibration arm in an inner side portion and the two vibration arms in outer side portions are made to vibrate with reverse phases by setting directions of electric fields that are applied to the vibration arms to be opposite to each other.

Patent Document 1: Japanese Patent No. 5071058.

Patent Document 2: Japanese Unexamined Patent Application Publication No. 56-085921.

In vibration with the reverse phases, as illustrated in FIG. 1(c) in Patent Document 1, torsion moments about center axes extending in parallel with a Y axis are generated on the respective vibration arms. In the base portion of the resonator, the torsion moments generate bending vibration about rotating axes, which are defined to be in parallel with the center axes of the vibration arms, between the center axes of the adjacent vibration arms vibrating with the reverse phases. The vibration is transmitted to the base from the base portion while passing through the support portion. The base is held between the lower substrate and the upper substrate and the vibration attenuates in the base to some extent.

SUMMARY

The present inventors have found that the attenuation of the vibration distorts a resonant waveform and shifts a resonant frequency when an amplitude of the vibration of the vibration arms is large. The shift of the resonant frequency gives a large influence on resonance characteristics and phase noise and is therefore desired to be improved.

The present disclosure has been made in view of the technical limitations of conventional devices described above and it is an object thereof is to suppress shift of a resonant frequency in a resonator.

Accordingly, a resonator according to an exemplary aspect includes a vibration portion that has a base portion having a front end and a rear end opposing the front end and a plurality of vibration arms with fixed ends that are connected to the front end of the base portion and that extend away from the front end. Moreover, a frame or holding portion provided to surround at least part of a periphery of the vibration portion, and a holding arm is provided between the vibration portion and the frame or holding portion with one end connected to the base portion and the other end connected to a region of the frame or holding portion at the front end side relative to the rear end of the base portion.

According to the present disclosure, a shift of a resonant frequency can be suppressed in the exemplary resonator.

DETAILED DESCRIPTION OF EXEMPLARY EMBODIMENTS

First Embodiment

Hereinafter, a first exemplary embodiment will be described with reference to the accompanying drawings.

Figure 1:
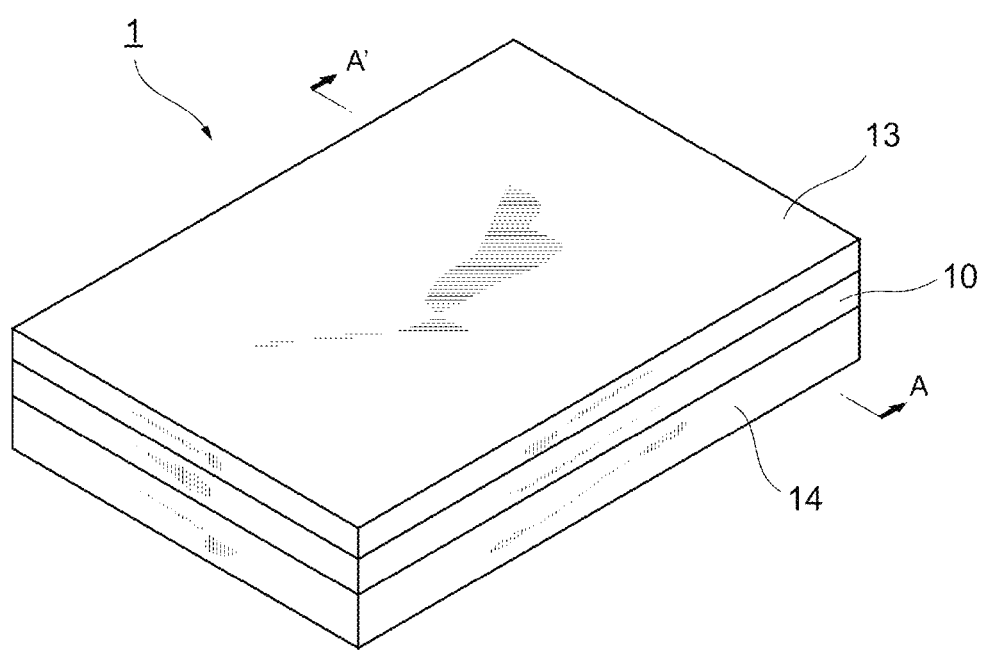
FIG. 1 is a perspective view schematically illustrating an outer appearance of a resonance device according to a first exemplary embodiment.
Figure 2:
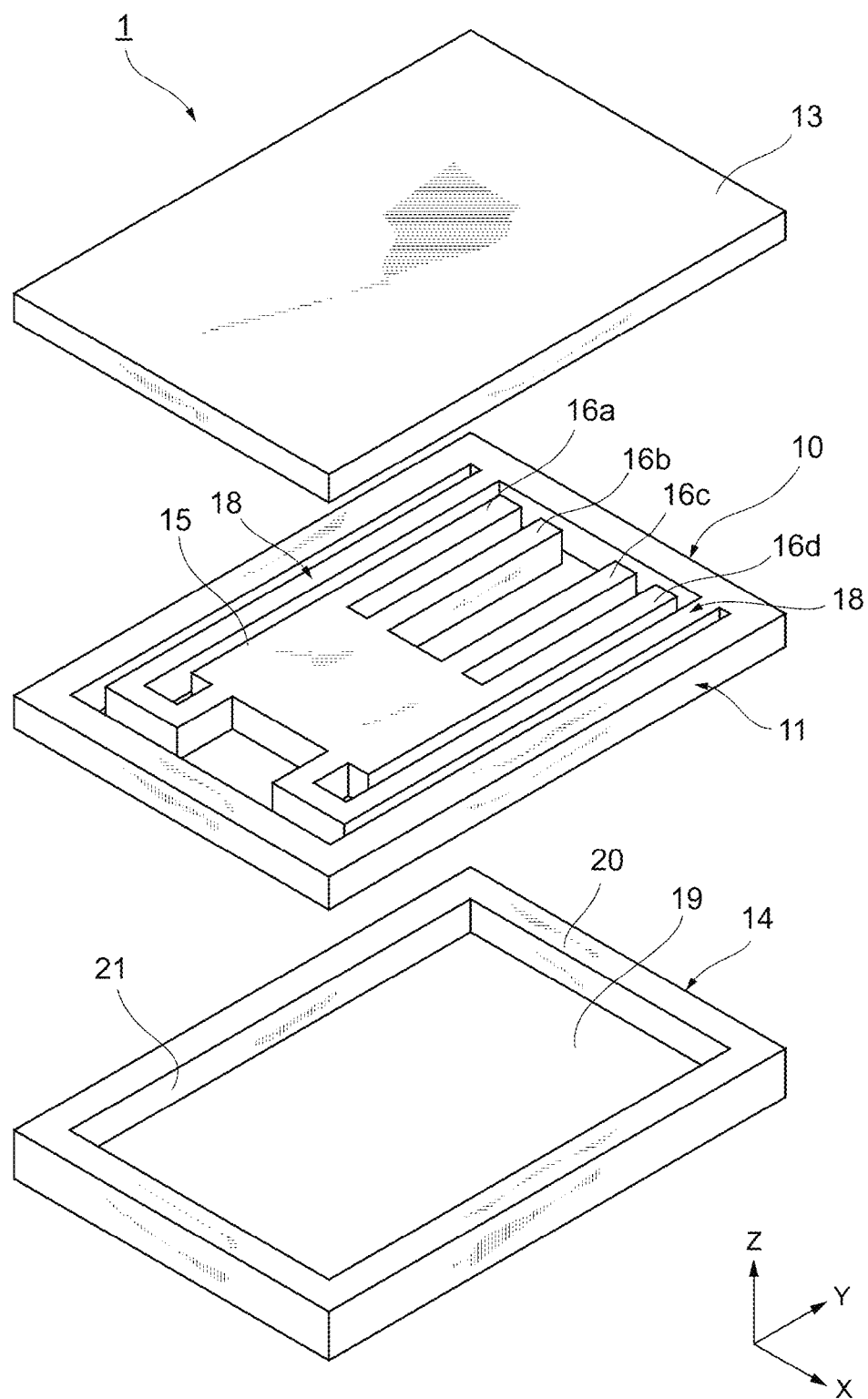
FIG. 2 is an exploded perspective view schematically illustrating the configuration of the resonance device in the first exemplary embodiment.
Figure 3:
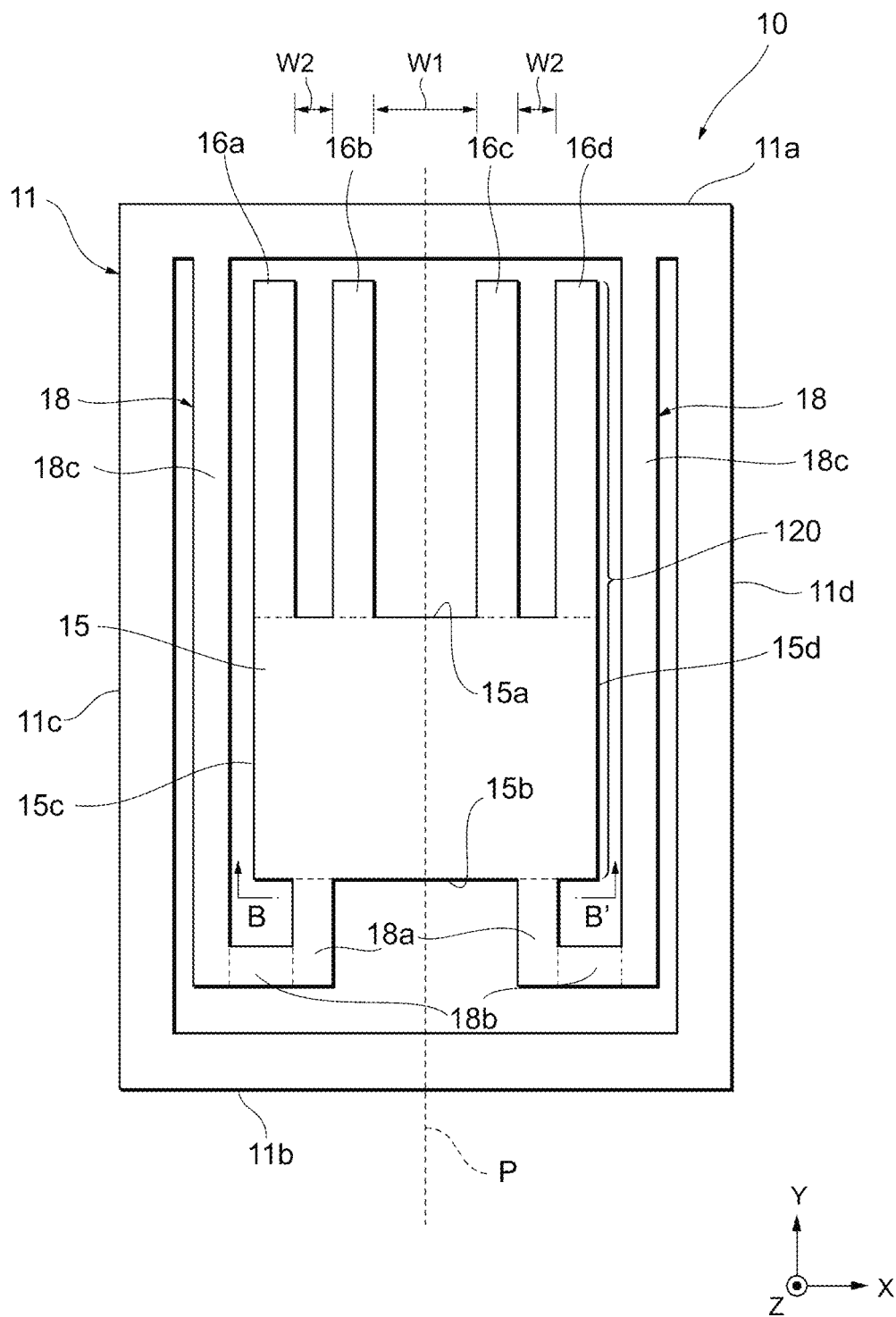
FIG. 3 is a plan view of a resonator in the first exemplary embodiment in a state in which an upper substrate is detached.

FIG. 1 is a perspective view schematically illustrating an outer appearance of a resonance device 1 in the first exemplary embodiment. FIG. 2 is an exploded perspective view schematically illustrating the configuration of the resonance device 1 in the first exemplary embodiment. FIG. 3 is a cross-sectional view along line AA' of FIG. 1.

As shown, the resonance device 1 includes a resonator 10, and an upper lid 13 and a lower lid 14 that seal the resonator 10 interposed therebetween and form a vibration space in which the resonator 10 vibrates. The resonance device 1 is configured by laminating the lower lid 14, the resonator 10, and the upper lid 13 in this order and bonding them to each other.

In an exemplary aspect, the resonator 10 is an MEMS resonator that is manufactured by an MEMS technique.

Moreover, the resonator 10 and the upper lid 13 are bonded to each other to thereby form the vibration space of the resonator 10 and seal the resonator 10. Each of the resonator 10, the upper lid 13, and the lower lid 14 is formed using a Si substrate and the Si substrates are bonded to each other to form the vibration space of the resonator 10. Each of the resonator 10 and the lower lid 14 may be formed using an SOI substrate.

Hereinafter, the respective structures of the resonance device 1 will be described in detail.

(1. Upper Lid 13)

FIG. 2 is an exploded perspective view schematically illustrating the configuration of the resonance device 1 in the first exemplary embodiment. The upper lid 13 extends in a planar form along an XY plane and a recess portion having, for example, a flat rectangular parallelepiped shape is formed on the back surface thereof. The recess portion forms a part of the vibration space of the resonator 10.

(2. Lower Lid 14)

The lower lid 14 has a bottom plate 19 provided along the XY plane and having a rectangular flat plate shape and a side wall 20 extending in a Z-axis direction from a peripheral edge portion of the bottom plate 19. The inner surfaces of the lower lid 14, that is, the surface of the bottom plate 19 and the inner surfaces of the side wall 20 form a recess portion 21. The recess portion 21 forms a part of the vibration space of the resonator 10.

The above-described upper lid 13 and lower lid 14 seal the vibration space in an airtight manner to maintain a vacuum state. The vibration space may be filled with a gas such as an inert gas, for example.

(3. Resonator 10)

FIG. 3 is a plan view schematically illustrating the configuration of the resonator 10 in the embodiment. The respective structures of the resonator 10 in the embodiment will be described with reference to FIG. 3. The resonator 10 includes a vibration portion 120, a frame or holding portion 11 (the terms are used interchangeably), and a pair of holding arms 18.

(a) Vibration Portion 120

The vibration portion 120 has a plate-like contour that extends in a planar form along the XY plane in an orthogonal coordinate system in FIG. 3. The vibration portion 120 is provided in an inner side portion of the frame or holding portion 11 and a space is formed at a predetermined interval between the vibration portion 120 and the holding portion 11. In an example of FIG. 3, the vibration portion 120 has a base portion 15 and four vibration arms 16a to 16d. It should be appreciated that the number of vibration arms is not limited to four and is set to the desired number, for example, equal to or more than three.

According to the exemplary aspect, the base portion 15 is a substantially rectangular parallelepiped-shaped plate having a first longer side 15a (as an example of a front end) in an X-axis direction and a second longer side 15b (as an example of a rear end) opposing the longer side 15a, and shorter sides 15c and 15d in the Y-axis direction. In the example of FIG. 3, the base portion 15 is connected to the frame or holding portion 11 on the longer side 15b with the holding arms 18, which will be described later, to be held. The base portion 15 has the width of approximately 250 μm in the X-axis direction and has the length of approximately 100 μm in the Y-axis direction, for example. The base portion 15 is not limited to having the rectangular parallelepiped shape and it is sufficient that it is formed to have a substantially plane-symmetric shape with respect to a plane defined along a perpendicular bisector of the longer side 15a. The base portion 15 may have a trapezoidal shape in which the longer side 15b is shorter than the longer side 15a or a semicircular shape the diameter of which is the longer side 15a, for example. Furthermore, the longer sides 15a and 15b and the shorter sides 15c and 15c are not limited to straight lines and may be curves. It is noted that the term "substantially" takes into account minor variations in the dimensions that may occur as a result of the manufacturing process as would be appreciated to one skilled in the art, for example.

The respective vibration arms 16a to 16d are provided between the base portion 15 and the holding portion 11 so as to be in parallel with the Y-axis direction. The vibration arms 16a to 16d have first ends as fixed ends connected to the first longer side 15a of the base portion 15, extend in the direction of away from the first longer side 15a of the base portion 15, and have the second ends as free ends (as an example of open ends). It should be noted that the direction in which the vibration arms 16a to 16d extend is not limited to the direction along frame bodies 11c and 11d of the holding portion 11, which will be described later. For example, the vibration arms 16a to 16d may extend obliquely with respect to the frame bodies 11c and 11d. In the embodiment, the respective vibration arms 16a to 16d are formed integrally with the base portion 15. The respective vibration arms 16a to 16d are formed to have prism shapes extending in the Y-axis direction and have the same size. In the exemplary aspect, the vibration arms 16a to 16d have the width of approximately 50 μm in the X-axis direction, have the length of approximately 480 μm in the Y-axis direction, and have the thickness of approximately 6 μm in the Z-axis direction, for example.

As illustrated in FIG. 3, in the vibration portion 120 in the exemplary embodiment, the two vibration arms 16a and 16d are arranged in outer side portions and the two vibration arms 16b and 16c are arranged in inner side portions in the X-axis direction. An interval W1 between the vibration arms 16b and 16c in the X-axis direction is set to be larger than an interval W2 between the vibration arm 16a (16d) (as an example of a first vibration arm) in the outer side portion and the vibration arm 16b (16c) (as an example of a second vibration arm) in the inner side portion, which is adjacent to the vibration arm 16a (16d) in the outer side portion, in the X-axis direction. The interval W1 is, for example, approximately 30 μm and the interval W2 is, for example, approximately 10 μm. Vibration characteristics are improved by setting the interval W1 to be larger than the interval W2. The interval W1 may be set to be equal to or smaller than the interval W2 in order to reduce the resonance device 1 in size.

(b) Holding Portion 11

The holding portion 11 (also considered a frame of the resonator 10) is formed to have a rectangular frame shape along the XY plane. It is sufficient that the holding portion 11 is provided at at least a part of a periphery of the vibration portion 120 and is not limited to having a complete frame shape. In the exemplary embodiment, the holding portion 11 is provided so as to surround an outer side portion of the vibration portion 120 along the XY plane. The holding portion 11 is formed by frame bodies 11a (as an example of a first fixing portion), 11b, 11c (as an example of a second fixing portion), and 11d (as an example of the second fixing portion) each of which has a quadrangular prism shape. It should be noted that the frame bodies 11a to 11d are integrally formed.

The frame body 11a is provided in the X-axis direction so as to face the free ends of the vibration arms 16a to 16d. The frame body 11b is provided in the X-axis direction so as to face the longer side 15b of the base portion 15. The frame body 11c is provided in the Y-axis direction so as to face the longer side of the vibration arm 16a and both ends of which are respectively connected to first ends of the frame bodies 11a and 11b. The frame body 11d is provided in the Y-axis direction so as to face the longer side of the vibration arm 16d and both ends of which are respectively connected to the other ends of the frame bodies 11a and 11b.

In the following description, the frame body 11a side is assumed to the upper side of the resonator 10 and the frame body 11b side is assumed to the lower side of the resonator 10.

(c) Holding Arm 18

The pair of holding arms 18 are provided in an inner side portion of the holding portion 11 and connect the longer side 15b of the base portion 15 and the frame body 11a. First ends of the holding arms 18 are connected to the base portion 15 and the other second ends thereof are connected to regions of the holding portion 11 at the longer side 15a side relative to the longer side 15b of the base portion 15.

As illustrated in FIG. 3, the pair of holding arms 18 are formed to have a substantially plane-symmetric shape with respect to a virtual plane P, which is defined along a center line of the base portion 15 in the X-axis direction so as to be in parallel with a YZ plane. Each of the pair of holding arms 18 has arms 18a, 18b, and 18c. The pair of holding arms 18 have first ends that are connected to the longer side 15b of the base portion 15 and extend therefrom toward the frame body 11b. Each of the pair of holding arms 18 is bent in a direction toward the frame body 11c or 11d (that is to say, X-axis direction) and is further bent in a direction toward the frame body 11a (that is to say, Y-axis direction), and the other end thereof is connected to the frame body 11a.

Each arm 18a is provided between the base portion 15 and the frame body 11b so as to face the frame body 11c (11d) in such a manner that a lengthwise direction thereof is in parallel with the Y axis. The arm 18a has one first end that is connected to the base portion 15 on the longer side 15b of the base portion 15 and extends therefrom substantially perpendicularly to the longer side 15b, that is, in the Y-axis direction. An axis passing through the center of the arm 18a in the X-axis direction is desirably provided at an inner side portion relative to a center line of the vibration arm 16a (16d), and in the example of FIG. 3, the arm 18a is provided between the vibration arms 16a and 16b.

The other second end of the arm 18a is connected to one end of the arm 18b on the side surface thereof. In an exemplary aspect, the width of the arm 18a, which is defined in the X-axis direction, is approximately 20 μm, and the length of the arm 18a, which is defined in the Y-axis direction, is approximately 40 μm.

Each arm 18b is provided between the base portion 15 and the frame body 11b so as to face the frame body 11b in such a manner that the lengthwise direction thereof is in parallel with the X-axis direction. The arm 18b has one end that is connected to the other end of the arm 18a as the side surface thereof in an outer side portion relative to the base portion 15, and extends therefrom substantially perpendicularly to the arm 18a, that is, in the X-axis direction. The other end of the arm 18b is connected to one end of the arm 18c as the side surface thereof at the side facing the vibration portion 120. In an exemplary aspect, for example, the width of the arm 18b, which is defined in the Y-axis direction, is approximately 20 μm, and the length of the arm 18b, which is defined in the X-axis direction, is approximately 75 μm.

Each arm 18c is provided between the base portion 15 and the frame body 11c (11d) so as to face the frame body 11c (11d) in such a manner that the lengthwise direction thereof is in parallel with the Y-axis direction.

One end of the arm 18c is connected to the other end of the arm 18b on the side surface thereof. The other end of the arm 18c is connected to the frame body 11a in an outer side portion relative to a position facing the vibration portion 120 and the arm 18c extends therefrom substantially perpendicularly to the frame body 11a, that is, in the Y-axis direction.

In an exemplary aspect, for example, the width of the arm 18c, which is defined in the X-axis direction, is approximately 20 μm, and the length of the arm 18c, which is defined in the Y-axis direction, is approximately 680 μm.

As described above, the pair of holding arms 18 are configured to be connected to the base portion 15 on the arms 18a, are bent at connection places between the arms 18a and 18b and connection places between the arms 18b and 18c, and then, are connected to the holding portion 11.

(4. Lamination Configuration)

Figure 4:
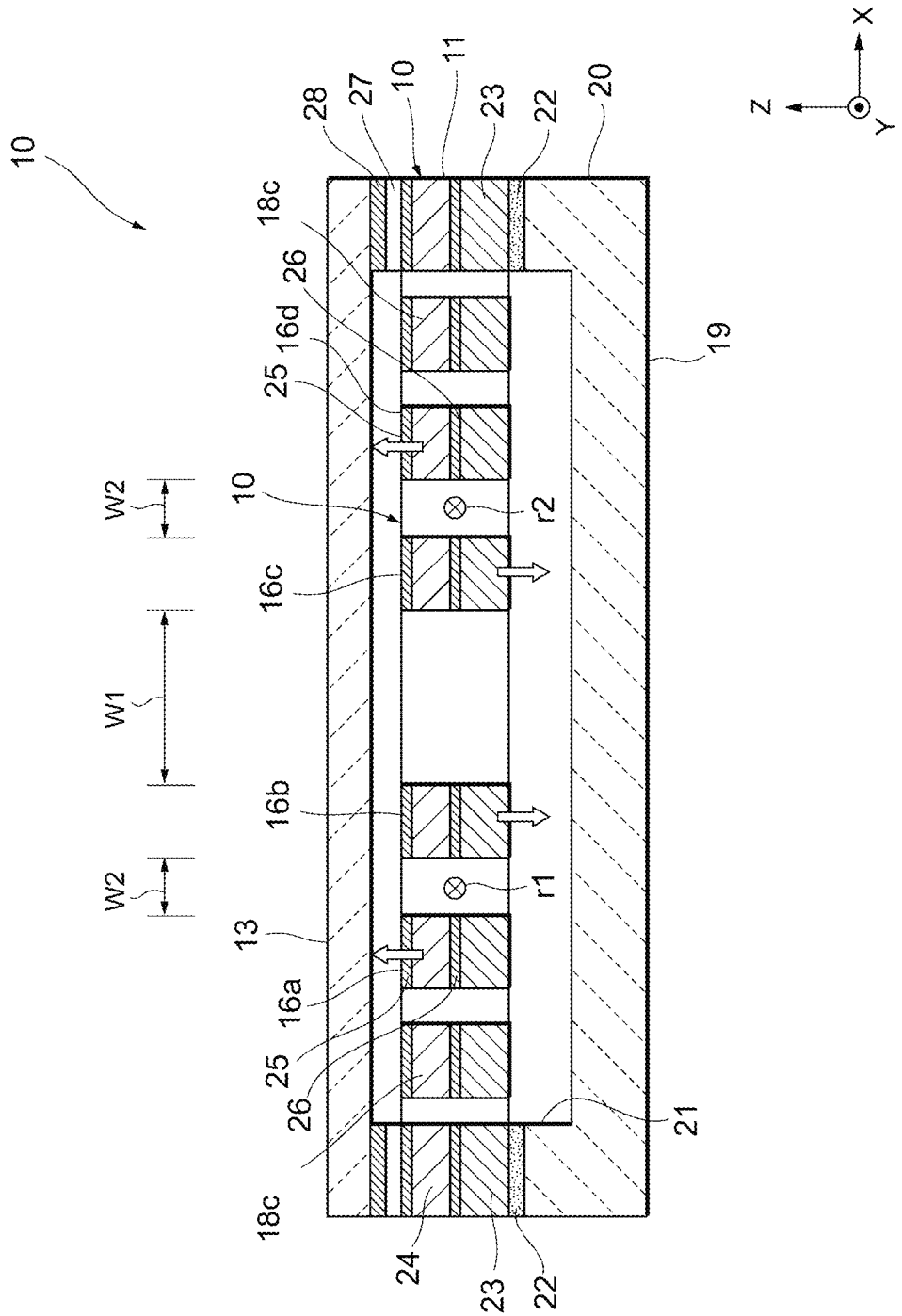
FIG. 4 is a cross-sectional view along line A-A' of FIG. 1.

The lamination configuration of the resonance device 1 will be described with reference to FIG. 4. FIG. 4 is a cross-sectional view along line AA' of FIG. 1.

As illustrated in FIG. 4, in the resonance device 1 in the embodiment, the holding portion 11 of the resonator 10 is bonded onto the side wall 20 of the lower lid 14 and the upper lid 13 is further bonded onto the resonator 10 in a covering manner. The resonator 10 is thus held between the lower lid 14 and the upper lid 13, and the lower lid 14, the upper lid 13, and the holding portion 11 of the resonator 10 form the vibration space in which the vibration arms 16a to 16d vibrate.

The bottom plate 19 and the side wall 20 of the lower lid 14 are integrally formed with Si (silicon). A SiO$_2$ (silicon dioxide) film 22 is formed on the upper surface of the side wall 20, and the lower lid 14 and the holding portion 11 of the resonator 10 are bonded to each other with the SiO$_2$ film 22. The thickness of the lower lid 14, which is defined in the Z-axis direction, is set to, for example, 150 μm, and the depth of the recess portion 21 is set to, for example, 50 μm.

The upper lid 13 is formed with a Si (silicon) wafer having a predetermined thickness. As illustrated in FIG. 4, the upper lid 13 is bonded to the holding portion 11 of the resonator 10 on a peripheral portion thereof. For example, an Au (gold) film 27 and an Sn (tin) film 28 are formed between the peripheral edge portion of the upper lid 13 and the holding portion 11 in order to bond the upper lid 13 and the holding portion 11 to each other.

In the resonator 10, the holding portion 11, the base portion 15, the vibration arms 16a to 16d, and the holding arms 18 are formed by the same process in an exemplary aspect. In the resonator 10, first, a metal layer 26 is laminated on a Si (silicon) layer 23. A piezoelectric thin film 24 is laminated on the metal layer 26 so as to cover the metal layer 26 and a metal layer 25 is further laminated on the piezoelectric thin film 24.

The Si layer 23 is formed by, for example, a degenerated n-type Si semiconductor having the thickness of approximately 10 μm, and can contain, as an n-type dopant, P (phosphorus), As (arsenic), Sb (antimony), or the like. It should be noted that a $SiO_2$ layer may be formed on the lower surface of the Si layer 23 in order to improve temperature characteristics.

The metal layers 25 and 26 are formed using Mo (molybdenum), Al (aluminum), or the like having the thickness of approximately 0.1 μm, for example. The Si layer 23 as the degenerated semiconductor may be used as the metal layer 26 without forming the metal layer 26.

The metal layers 25 and 26 are laminated in the resonator 10, and then, are formed to have more desirable shapes by processing such as etching.

The metal layer 26 is processed by etching or the like so as to form a lower electrode on the vibration portion 120, for example. The metal layer 26 is processed by etching or the like so as to form a wiring for connecting the lower electrode to an alternating-current (AC) power supply provided at the outside of the resonator 10, for example, on the holding arms 18 and the holding portion 11.

Meanwhile, the metal layer 25 is processed by etching or the like so as to form an upper electrode on the vibration portion 120, for example. The metal layer 25 is processed by etching or the like so as to form a wiring for connecting the upper electrode to the AC power supply provided at the outside of the resonator 10, for example, on the holding arms 18 and the holding portion 11.

For connection to a lower wiring or an upper wiring from the AC power supply, the configuration in which an electrode is formed on the outer surface of the upper lid 13 and the electrode connects the AC power supply and the lower wiring or the upper wiring or the configuration in which a via is formed in the upper lid 13, the via is filled with a conductive material to provide a wiring, and the wiring connects the AC power supply and the lower wiring or the upper wiring may be employed.

In the exemplary embodiment, the piezoelectric thin film 24 is a thin film of a piezoelectric body that converts an applied voltage into vibration, and can contain, for example, nitride such as AlN (aluminum nitride) or oxide as a main component. To be specific, the piezoelectric thin film 24 can be formed with ScAlN (scandium aluminum nitride). ScAlN is provided by substituting a part of aluminum in aluminum nitride with scandium. The piezoelectric thin film 24 has the thickness of, for example, 0.8 μm.

The piezoelectric thin film 24 expands and contracts in an in-plane direction of the XY plane, that is, the Y-axis direction in accordance with an electric field that is applied to the piezoelectric thin film 24 by the metal layers 25 and 26. The expansion and contraction of the piezoelectric thin film 24 cause the vibration arms 16a to 16d to vibrate in an out-of-plane bending vibration mode while the free ends thereof are displaced toward the inner surfaces of the lower lid 14 and the upper lid 13.

In the exemplary embodiment, as illustrated in FIG. 4, a phase of an electric field that is applied to the vibration arms 16a and 16d in the outer side portions and a phase of an electric field that is applied to the vibration arms 16b and 16c in the inner side portions are set to be reversed. With this, the vibration arms 16a and 16d in the outer side portions and the vibration arms 16b and 16c in the inner side portions are displaced in the opposite directions to each other. For example, when the free ends of the vibration arms 16a and 16d in the outer side portions are displaced toward the inner surface of the upper lid 13, the free ends of the vibration arms 16b and 16c in the inner side portions are displaced toward the inner surface of the lower lid 14.

In the above-described resonance device 1, in the vibration with reverse phases, the vibration arm 16a and the vibration arm 16b vibrate about a center axis r1 in the directions that are vertically opposite to each other, the center axis r1 extending in parallel with the Y axis between the vibration arm 16a and the vibration arm 16b illustrated in FIG. 4. Furthermore, the vibration arm 16c and the vibration arm 16d vibrate about a center axis r2 in the directions that are vertically opposite to each other, the center axis r2 extending in parallel with the Y axis between the vibration arm 16c and the vibration arm 16d. With this, torsion moments in the opposite directions are generated in the center axes r1 and r2 and bending vibration is generated in the base portion 15.

Figure 5:
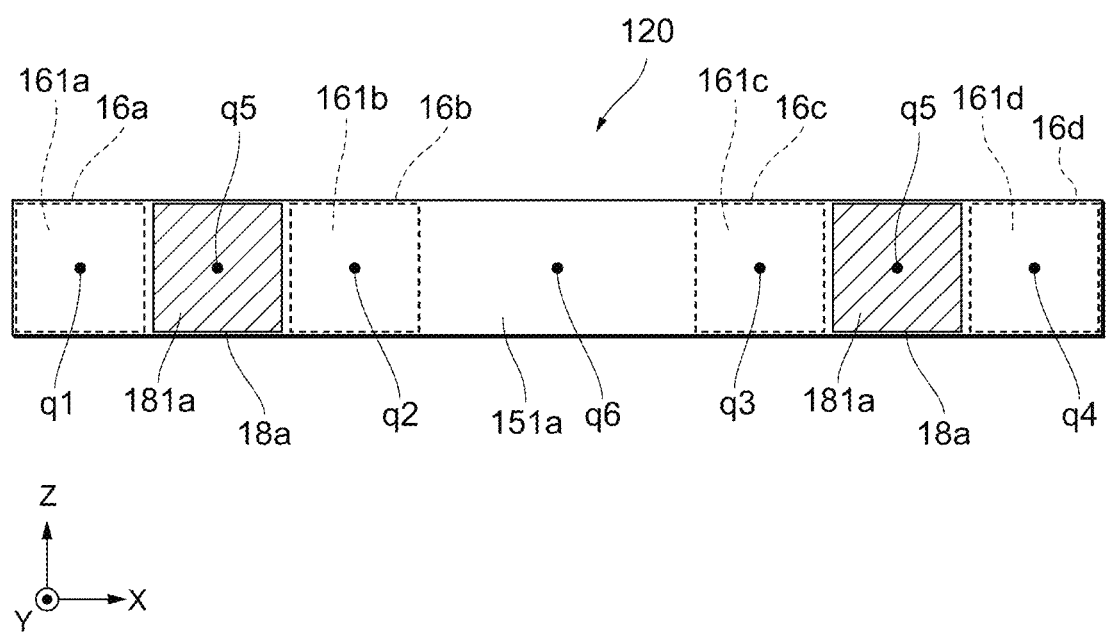
FIG. 5 is a cross-sectional view along line B-B' of FIG. 3.

Next, connection positions between the holding arms 18 and the base portion 15 will be described with reference to FIG. 5 and FIG. 6. FIG. 5 is a cross-sectional view along line BB' of FIG. 3.

In FIG. 5, surfaces 161a to 161d indicated by dotted lines are virtual end surfaces expressing surfaces (or boundary surfaces) of the respective vibration arms 16a to 16d, which make contact with the end surface of the base portion 15 at the front end. Surfaces 181a are virtual end surfaces of the arms 18a and express surfaces (or boundary surfaces) of the arms 18a of the holding arms 18, which make contact with the end surface of the base portion 15 at the rear end. A surface 151a is a contact surface (front end surface) of the base portion 15 with the vibration arms 16a to 16d. Furthermore, points q1 to q4 indicate centers of the end surfaces 161a to 161d, respectively, points q5 indicate centers of the end surfaces 181a, and a point q6 indicates a center of the front end surface 151a. It is be noted that the center of a surface indicates, for example, the middle or the center of gravity of the surface. It is sufficient that the center of the surface is at least the middle of the surface in the X-axis direction.

As illustrated in FIG. 5, the center points q5 of the end surfaces 181a of the holding arms 18 are located at the sides of the vibration arms 16b and 16c in the inner side portions relative to the vibration arms 16a and 16d connected to the base portion 15 in outermost side portions of the base portion 15. More preferably, the holding arms 18 are connected to the base portion 15 such that distances from the center points q5 to the center point q6 of the front end surface 151a are equal to or smaller than 0.6-fold of the half of the length (hereinafter, also referred to as "base portion width") of a straight line having the maximum length among straight lines which pass through the surface of the base portion 15 and are in parallel with the longer side 15a in the base portion 15. In the exemplary embodiment, the base portion width indicates the length of the longer side 15a because the base portion 15 has the rectangular shape. In this case, a DLD (Drive Level Dependency) of the resonator 10 can be improved. More preferably, the first ends of the holding arms 18 are connected to the base portion 15 in regions in which displacement of vibration of the base portion 15 is minimum. In this case, fluctuation in a vibration frequency of the resonator 10 can be reduced.

It is be noted that the base portion width may be defined as follows. That is to say, when a maximum distance between the front end and the rear end in the lengthwise direction as the direction toward the rear end (point on the longer side 15a in FIG. 3) from the front end (point on the longer side 15b in FIG. 3) of the base portion 15 is set to the base portion length, a maximum distance between a left end (shorter side 15c in FIG. 3) of the base portion 15 and a right end (shorter side 15c in FIG. 3) thereof in a width direction orthogonal to the above-described lengthwise direction can also be defined as the base portion width.

Figure 6:
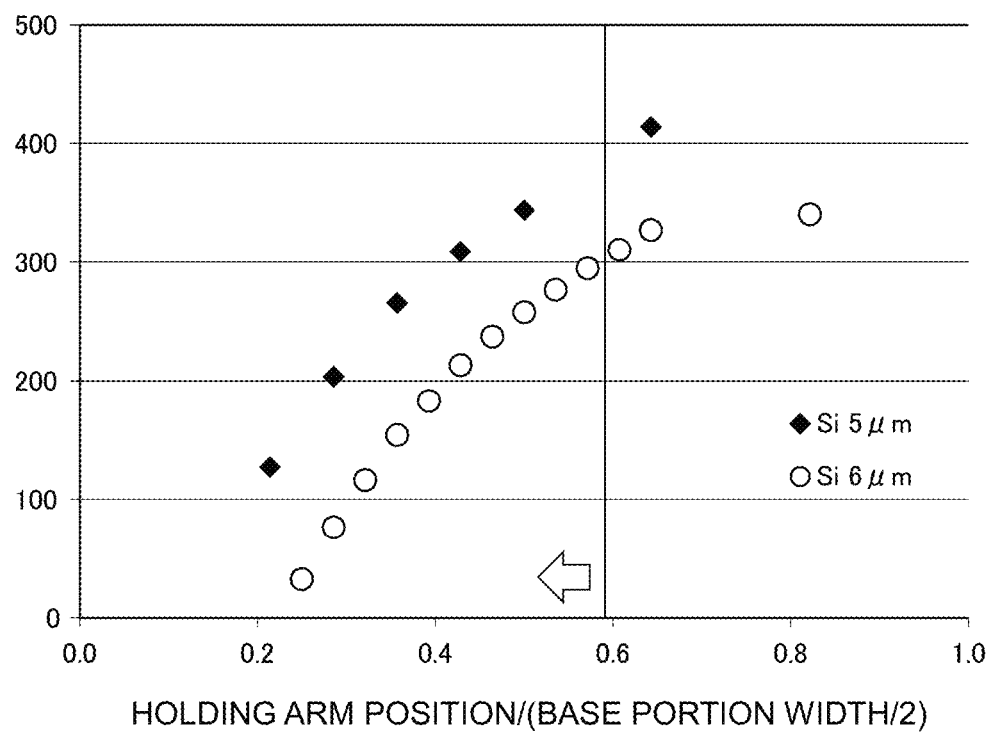
FIG. 6 is a graph illustrating a relation between a connection position of holding arms to a base portion and a DLD.

FIG. 6 is a graph illustrating variation in the DLD relative to the connection positions between the holding arms 18 and the base portion 15. The transverse axis indicates a rate of the distance to the center point q6 from the center points q5 relative to a value of the half of the base portion width and the longitudinal axis indicates a displacement amount (ppm) of a frequency per unit power (μW). In an example of FIG. 6, first, a resonant frequency is measured using an impedance analyzer or the like while varying input power (μW). Thereafter, straight-line approximation is performed on a relation of the measured resonant frequency relative to the input power, and an inclination (change amount of the resonant frequency relative to the change amount of the input power) of the straight line is defined as the frequency displacement amount per unit power.

As illustrated in FIG. 6, when the rate of the distance to the center point q6 from the center points q5 relative to the value of the half of the base portion width is larger than 0.6, the DLD is substantially constant. However, the DLD is gradually decreased as the above-described rate is lower than 0.6 as a boundary point. It is seen that the DLD is largely improved by setting the rate of the distance to the center point q6 from the center point q5 relative to the value of the half of the base portion width to be equal to or lower than 0.6.

Figure 7:
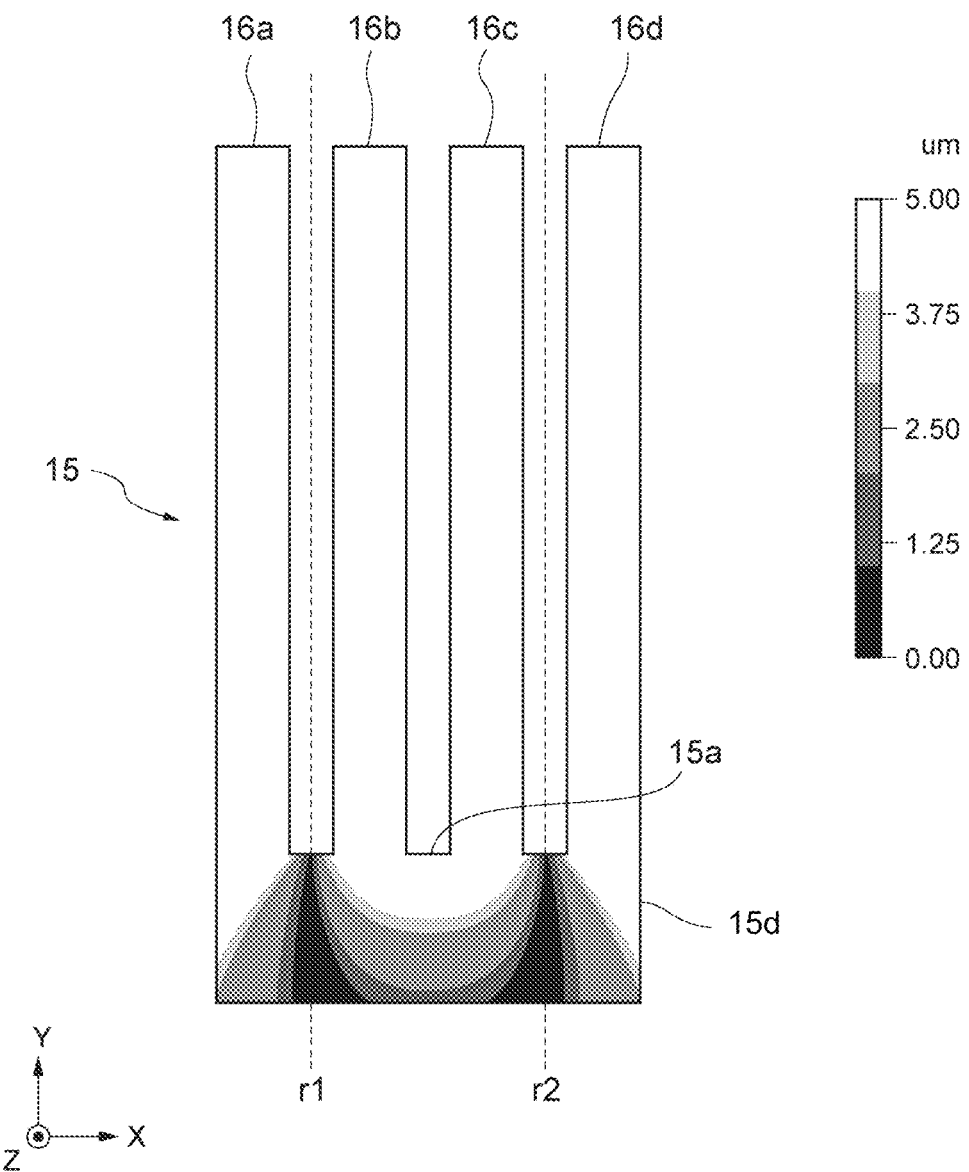
FIG. 7 is a view illustrating distribution of a vibration displacement amount of the resonator in the first exemplary embodiment.

FIG. 7 is a view schematically illustrating distribution of the displacement amount of the vibration portion 120 with vibration in the embodiment. In FIG. 7, portions of darker colors indicate sites with less displacement than portions of lighter colors. As illustrated in FIG. 7, the center axes r1 and r2 pass through the centers of the sites with less displacement than other sites.

Moments generated in the center axes r1 and r2 are transmitted to the overall base portion 15 from portions of the base portion 15 between the vibration arms 16a and 16b and between the vibration arms 16c and 16d (portions with the dark color in FIG. 7). In the resonance device 1 in the embodiment, the base portion 15 is connected to the holding portion 11 with the holding arms 18 interposed therebetween without being directly fixed to the holding portion 11. With this connection manner, the moment in a rotating direction can be dispersed in the holding arms 18, thereby reducing fluctuation in the vibration frequency of the resonator 10. Furthermore, this effect can be further improved by bending the holding arms 18.

The resonance device 1 in the exemplary embodiment is configured to suppress vibration leakage by connecting the base portion 15 and the holding arms 18 on the longer side 15b opposing the longer side 15a to which the vibration arms 16a to 16d are connected, thereby improving a Q value. Furthermore, the vibration characteristics can be further improved by providing connection points to the holding arms 18 on sites of the longer side 15b at which displacement with vibration is less than that of other places, preferably, the least. To be specific, the holding arms 18 are desirably connected to the longer side 15b such that the axes passing through the centers of the arms 18a in the X-axis direction are coincide with the center axes r1 and r2.

Second Embodiment

In a second and subsequent embodiments, description of common matters to those in the first embodiment is omitted and only different points are described. In particular, the same action effects with the same structures are not referred in each embodiment.

Figure 8:
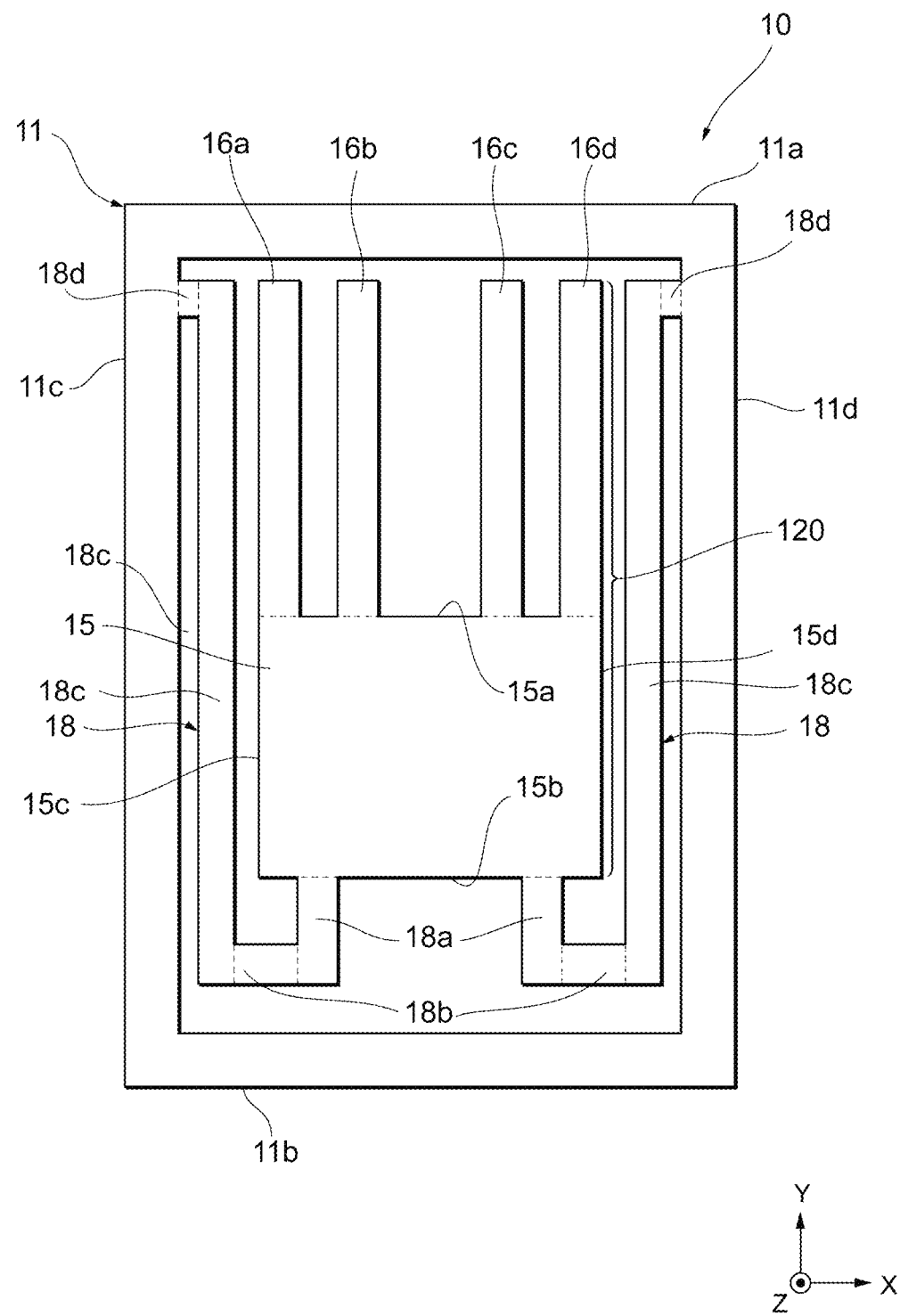
FIG. 8 corresponds to FIG. 3 and is a plan view of a resonator according to a second exemplary embodiment in a state in which an upper substrate is detached.

FIG. 8 is a view illustrating an example of a plan view of the resonator 10 in the embodiment. Hereinafter, points of the detail configuration of the resonance device 1 in the embodiment, which are different from the first embodiment, will be mainly described.

In the embodiment, the vibration portion 120 is connected to the holding portion 11 on the frame bodies 11c and 11d with the holding arms 18 which are connected to the longer side 15b of the base portion 15.

In the exemplary embodiment, the holding arms 18 have arms 18d in addition to the arms 18a to 18c. The pair of holding arms 18 have first ends that are connected to the longer side 15b of the base portion 15 and extend therefrom toward the frame body 11b. Each of the pair of holding arms 18 is bent in the direction toward the frame body 11c or 11d (that is to say, X-axis direction), is further bent in the direction toward the frame body 11a (that is to say, Y-axis direction), and is further bent in the direction toward the frame body 11c or 11d, and the other end thereof is connected to the frame body 11c or 11d.

Each arm 18c is provided between the base portion 15 and the frame body 11c (11d) so as to face the frame body 11c (11d) in such a manner that the lengthwise direction thereof is in parallel with the Y-axis direction.

One end of the arm 18c is connected to the arm 18b on the side surface thereof. The other end of the arm 18c is connected to one end of the arm 18d on the side surface thereof. For example, the width of the arm 18c, which is defined in the X-axis direction, is approximately 20 μm, and the length of the arm 18c, which is defined in the Y-axis direction, is approximately 620 μm.

Each arm 18d is provided between the vibration arm 16a (16d) and the frame body 11c (11d) so as to face the frame body 11a in such a manner that the lengthwise direction thereof is in parallel with the X-axis direction. One end of the arm 18d is connected to the other end of the arm 18c as the side surface thereof at the side facing the frame body 11c (11d). The arm 18d has the other end that is connected to the frame body 11c (11d) at a position facing an end portion of the free end of the vibration arm 16a (16d) and extends therefrom substantially perpendicularly to the frame body 11c (11d), that is, in the X-axis direction. For example, the width of the arm 18d, which is defined in the Y-axis direction, is approximately 20 μm, and the length of the arm 18d, which is defined in the X-axis direction, is approximately 10 μm.

Other arms of the holding arms 18 are the same as those in the first embodiment.

As described above, in the embodiment, the vibration portion 120 is connected to the frame bodies 11c and 11d with the holding arms 18. The moments in the holding arms 18 can be further dispersed by increasing bent places of the holding arms 18, thereby further improving the effect of suppressing the resonant frequency.

Other configurations and effects are the same as those in the first embodiment.

Third Embodiment

Figure 9:
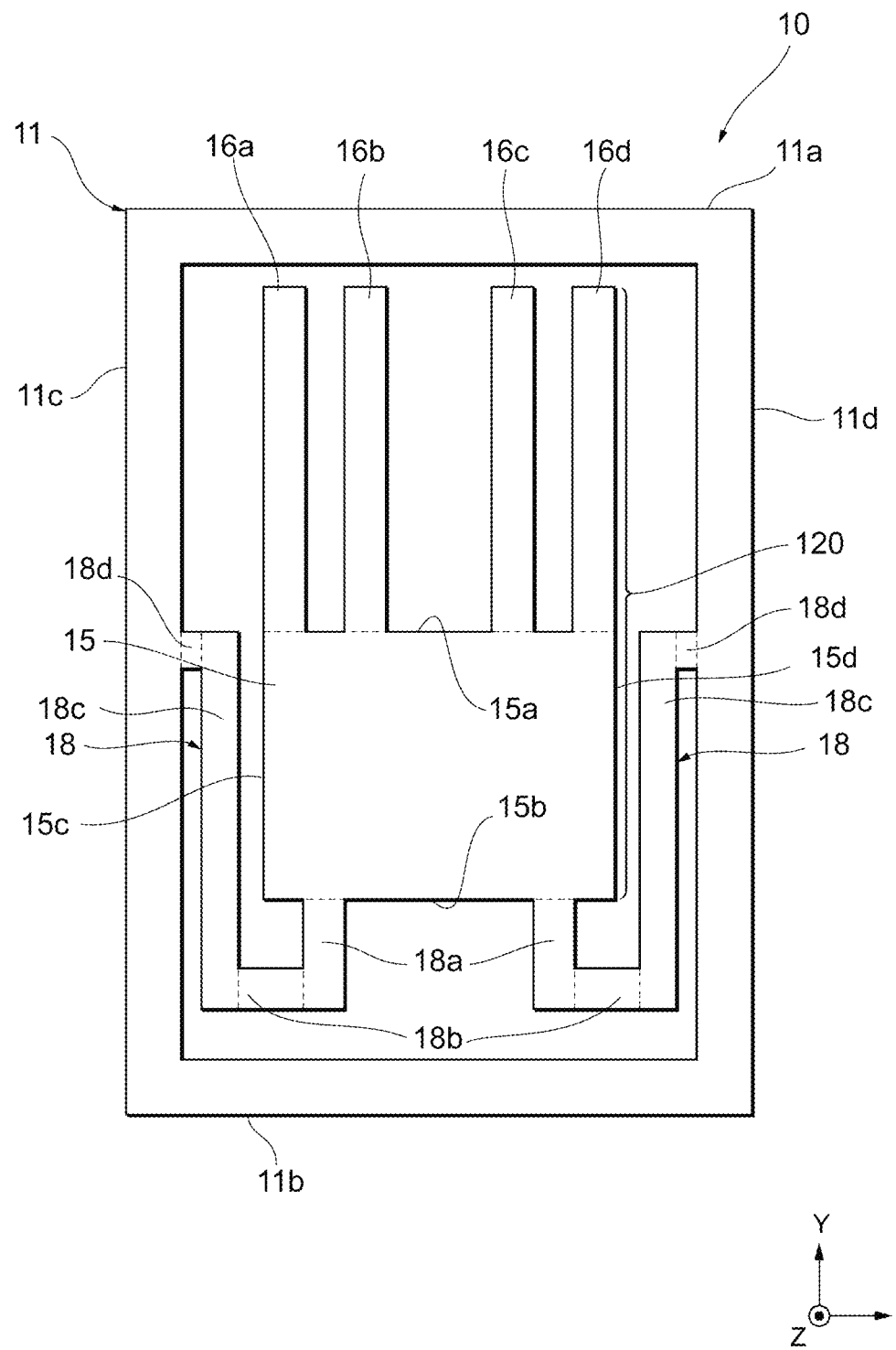
FIG. 9 corresponds to FIG. 3 and is a plan view of a resonator according to a third exemplary embodiment in a state in which an upper substrate is detached.

FIG. 9 is a view illustrating an example of a plan view of the resonator 10 in the embodiment. Hereinafter, points of the detail configuration of the resonance device 1 in the embodiment, which are different from the first embodiment, will be mainly described.

In the embodiment, the vibration portion 120 is connected to the holding portion 11 on the frame bodies 11c and 11d with the holding arms 18 which are connected to the longer side 15b of the base portion 15.

In the embodiment, the holding arms 18 have arms 18d in addition to the arms 18a to 18c. The pair of holding arms 18 have first ends that are connected to the longer side 15b of the base portion 15 and extend therefrom toward the frame body 11b. Each of the pair of holding arms 18 is bent in the direction toward the frame body 11c or 11d (that is to say, X-axis direction), is bent in the direction toward the frame body 11a (that is to say, Y-axis direction), and is further bent in the direction toward the frame body 11c or 11d, and the other end thereof is connected to the frame body 11c or 11d.

Each arm 18c is provided between the base portion 15 and the frame body 11c(11d) so as to face the frame body 11c (11d) in parallel with the Y-axis direction.

One end of the arm 18c is connected to the arm 18b on the side surface thereof. The other end of the arm 18c is connected to one end of the arm 18d on the side surface thereof. For example, the width of the arm 18c, which is defined in the X-axis direction, is approximately 20 µm, and the length of the arm 18c, which is defined in the Y-axis direction, is approximately 140 µm.

Each arm 18d is provided between the vibration arm 16a (16d) and the frame body 11c (11d) so as to face the frame body 11a in such a manner that the lengthwise direction thereof is in parallel with the X-axis direction. One end of the arm 18d is connected to the other end of the arm 18c as the side surface thereof at the side facing the frame body 11c (11d). The arm 18d has the other end that is connected to the frame body 11c (11d) in the vicinity of a position facing a connection place between the longer side 15a of the base portion 15 and the vibration arm 16a (16d) and extends therefrom substantially perpendicularly to the frame body 11c (11d), that is, in the X-axis direction. For example, the width of the arm 18d, which is defined in the Y-axis direction, is approximately 20 µm.

Other arms of the holding arms 18 are the same as those in the first embodiment.

As described above, in the embodiment, the vibration portion 120 is connected to the frame bodies 11c and 11d with the holding arms 18. The moments in the holding arms 18 can be further dispersed by increasing bent places of the holding arms 18, thereby further improving the effect of suppressing the resonant frequency. Other configurations and effects are the same as those in the first embodiment.

Fourth Embodiment

Figure 10:
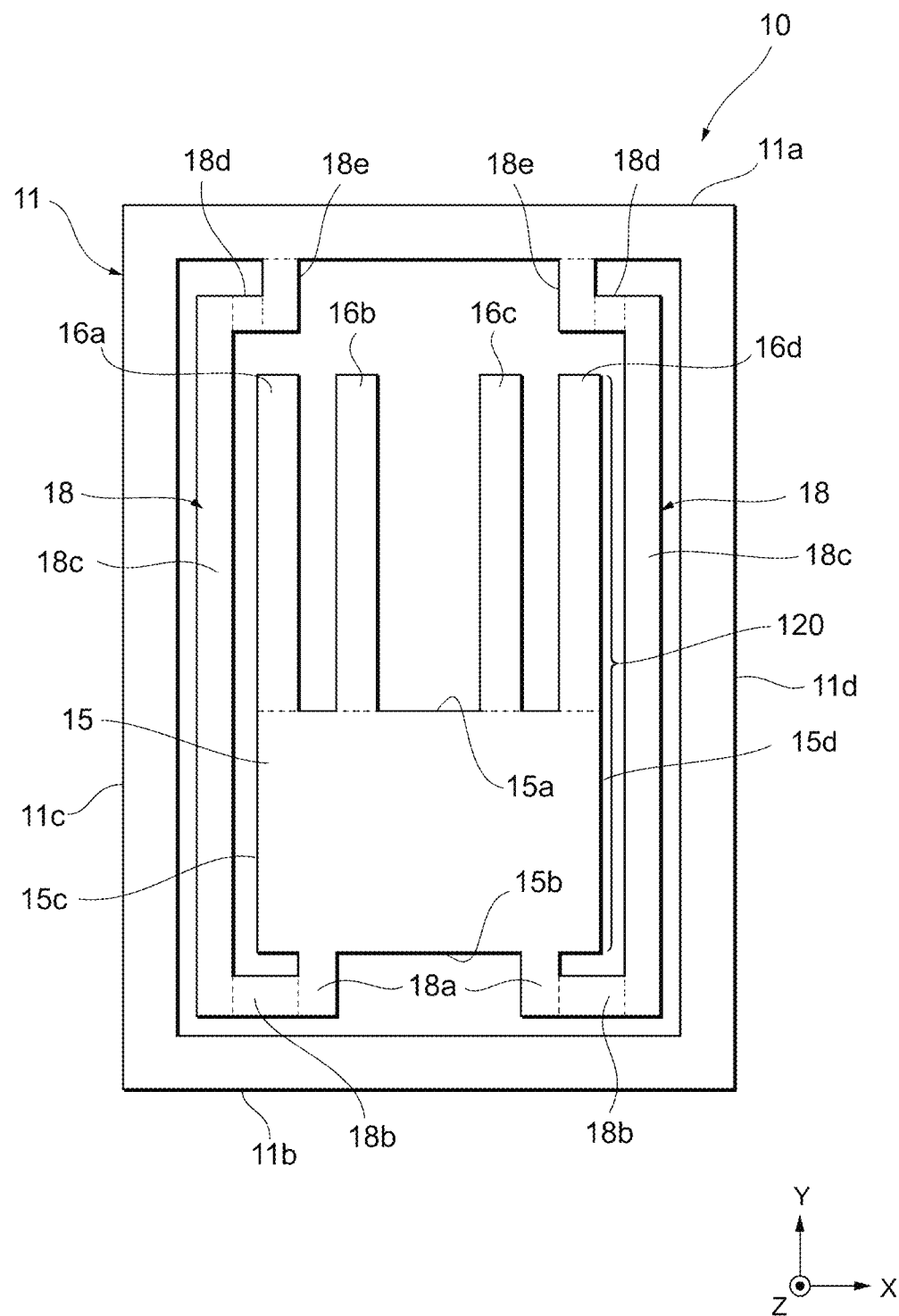
FIG. 10 corresponds to FIG. 3 and is a plan view of a resonator according to a fourth exemplary embodiment in a state in which an upper substrate is detached.

FIG. 10 is a view illustrating an example of a plan view of the resonator 10 in the embodiment. Hereinafter, points of the detail configuration of the resonance device 1 in the embodiment, which are different from the first embodiment, will be mainly described.

In the embodiment, the holding arms 18 have arms 18d and 18e in addition to the arms 18a to 18c. The pair of holding arms 18 have first ends that are connected to the longer side 15b of the base portion 15 and extend therefrom toward the frame body 11b. Each of the pair of holding arms 18 is bent in the direction toward the frame body 11c or 11d (that is to say, X-axis direction), is bent in the direction toward the frame body 11a (that is to say, Y-axis direction), is again bent in the direction toward the frame body 11d or 11c, and is further bent in the direction toward the frame body 11a, and the other end thereof is connected to the frame body 11a.

One end of the arm 18c is connected to the arm 18b on the side surface thereof. The other end of the arm 18c is connected to one end of the arm 18d on the side surface thereof. For example, the width of the arm 18c, which is defined in the X-axis direction, is approximately 20 µm, and the length of the arm 18c, which is defined in the Y-axis direction, is approximately 660 µm.

Each arm 18d is provided between the vibration arm 16a (16d) and the frame body 11c (11d) so as to face the frame body 11a in such a manner that the lengthwise direction thereof is in parallel with the X-axis direction. The arm 18d has one end that is connected to the other end of the arm 18c as the side surface thereof at the side facing the frame body 11c (11d) and extends therefrom substantially perpendicularly to the frame body 11c (11d), that is, in the X-axis direction. The other end of the arm 18d is connected to one end of the arm 18e as the side surface thereof at the side opposing the frame body 11c (11d). For example, the width of the arm 18d, which is defined in the Y-axis direction, is approximately 20 µm, and the length of the arm 18b, which is defined in the X-axis direction, is approximately 20 µm.

Each arm 18e is provided between the vibration arm 16a (16d) and the frame body 11a so as to face the frame body 11c (11d) in such a manner that the lengthwise direction thereof is in parallel with the Y-axis direction. One end of the arm 18e is connected to the other end of the arm 18d on the side surface thereof. The arm 18e has the other end that is connected to the frame body 11a at a position facing the vibration arm 16a (16d) and extends therefrom substantially perpendicularly to the frame body 11a, that is, in the Y-axis direction. For example, the width of the arm 18e, which is defined in the X-axis direction, is approximately 20 µm, and the length of the arm 18e, which is defined in the Y-axis direction, is approximately 40 µm.

Other arms of the holding arms 18 are the same as those in the first embodiment.

As described above, in the embodiment, the moments in the holding arms 18 can be further dispersed by increasing bent places of the holding arms 18, thereby further improving the effect of suppressing the resonant frequency.

Other configurations and effects are the same as those in the first embodiment.

Fifth Embodiment

Figure 11:
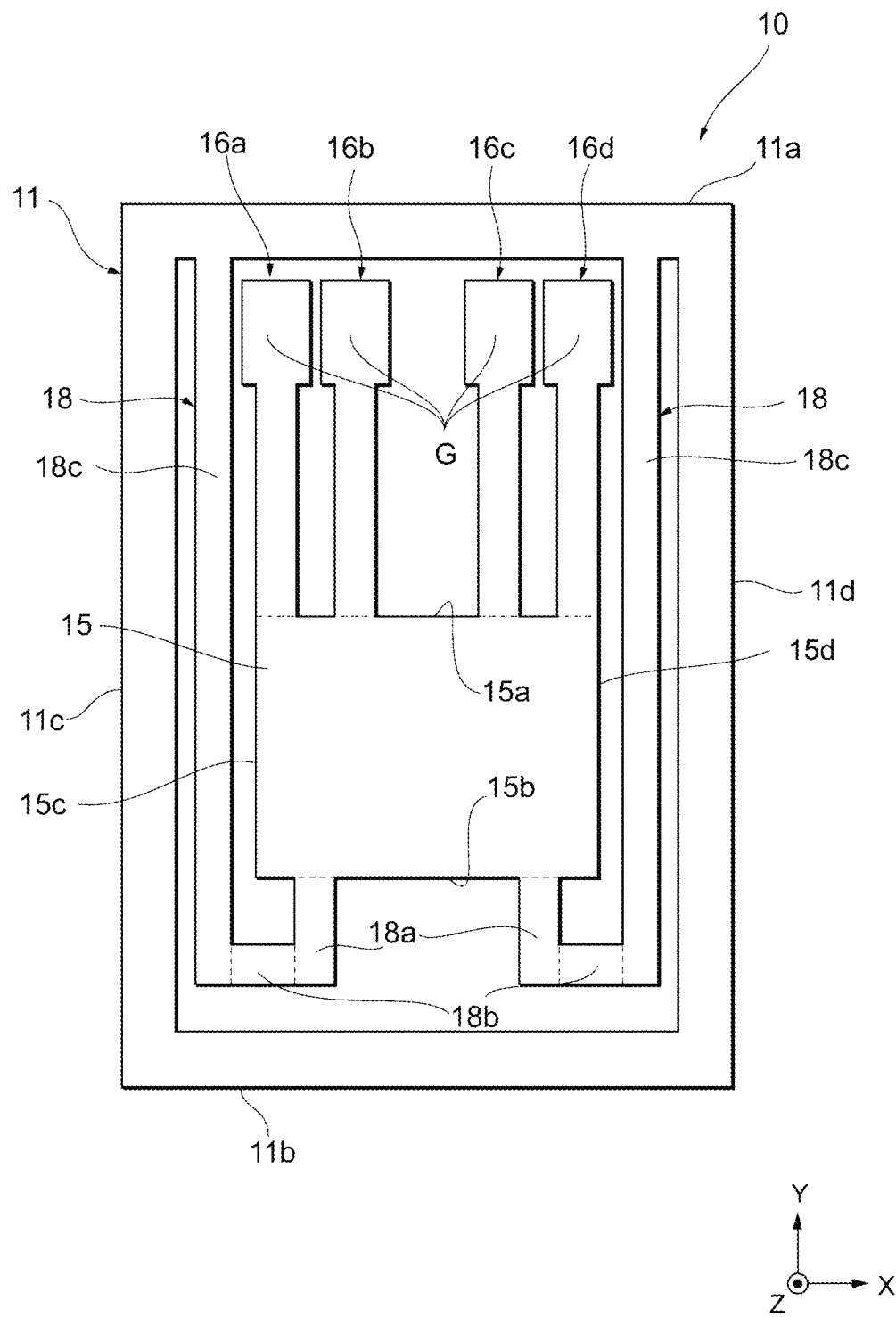
FIG. 11 corresponds to FIG. 3 and is a plan view of a resonator according to a fifth exemplary embodiment in a state in which an upper substrate is detached.

FIG. 11 is a view illustrating an example of a plan view of the resonator 10 in the embodiment. Hereinafter, points of the detail configuration of the resonance device 1 in the embodiment, which are different from the first embodiment, will be mainly described.

In the exemplary embodiment, the vibration arms 16a to 16d have weights G on the respective free ends thereof. The weights G are integrally formed by the same process as the vibration arms 16a to 16d, for example. The vibration arms 16a to 16d, respectively, have the weights G at the side of the free ends thereof, thereby increasing amplitudes of vibration in an up-down direction in the respective vibration arms.

Figure 12:
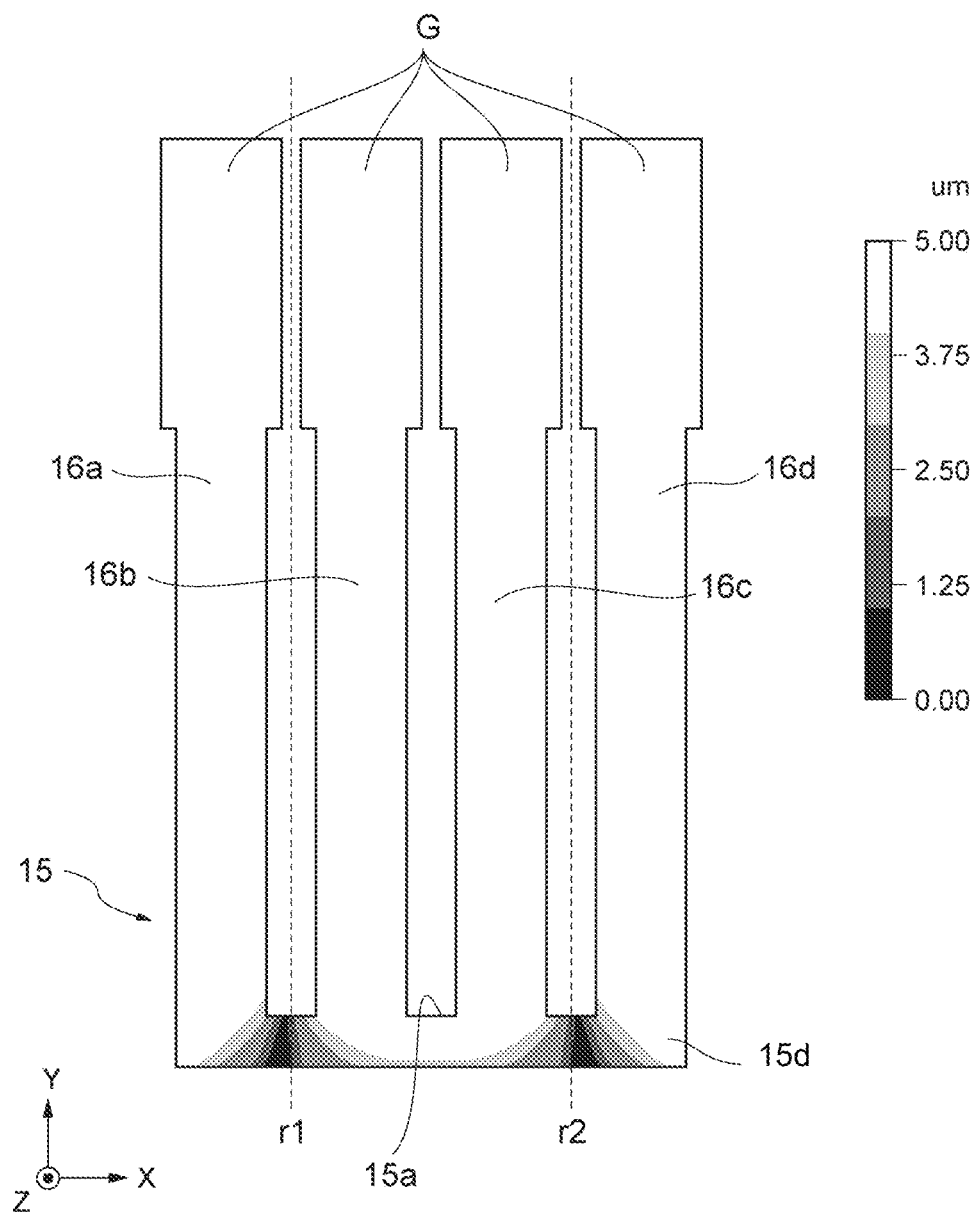
FIG. 12 corresponds to FIG. 7 and is a view illustrating distribution of vibration displacement of the resonator in the fifth exemplary embodiment.

FIG. 12 is a view schematically illustrating distribution of a displacement amount of the vibration portion 120 with vibration in the embodiment. In FIG. 12, portions of darker colors indicate sites with less displacement than portions of lighter colors. In the embodiment, the sites with less displacement than the other sites are wider than those in the first embodiment because the vibration arms 16a to 16d have the weights G. In the embodiment, the axes passing through the centers of the arms 18a in the X-axis direction are set to pass through the centers of the sites with less displacement than the other sites.

Other configurations and effects are the same as those in the first embodiment.

Sixth Embodiment

Figure 13:
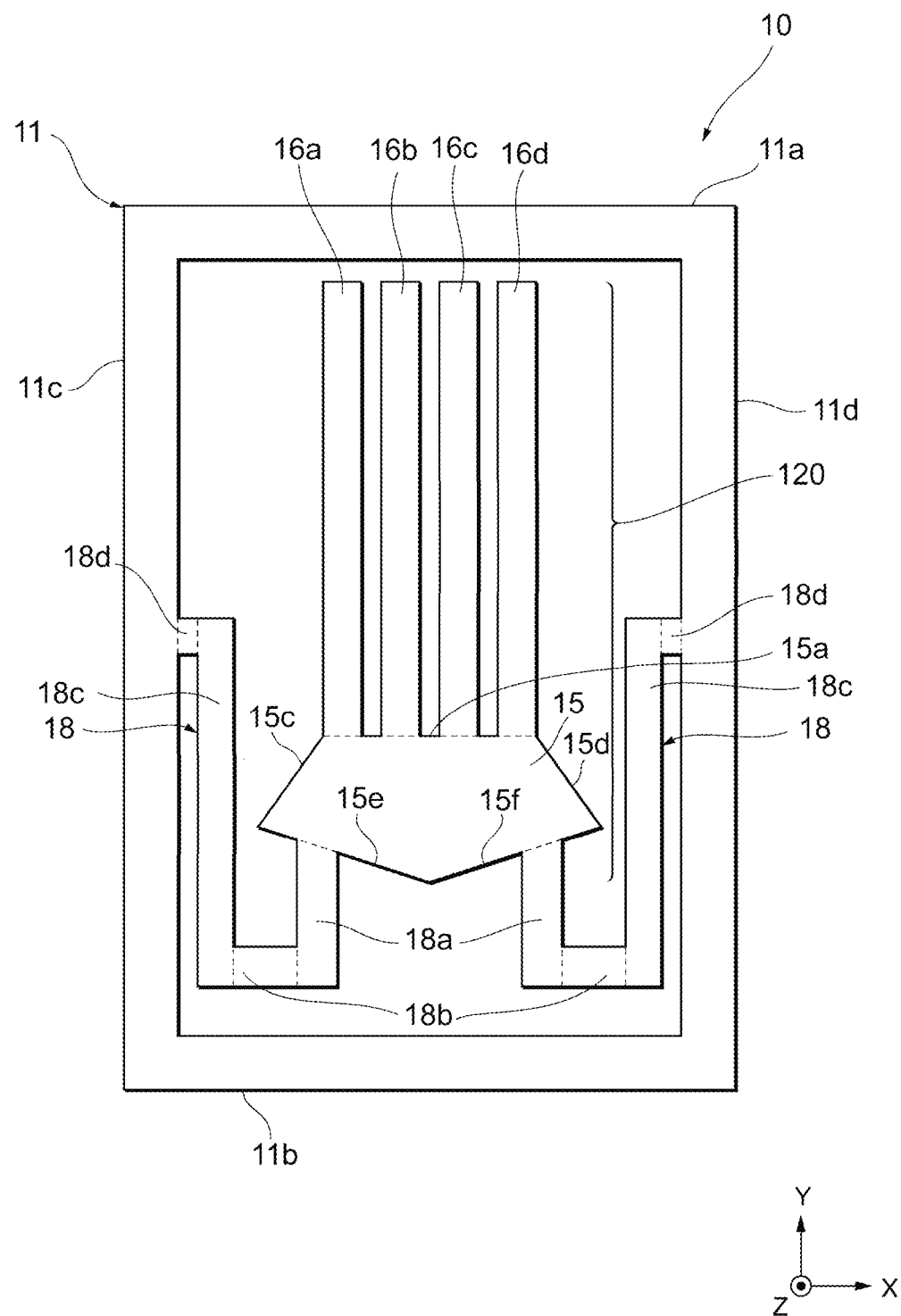
FIG. 13 corresponds to FIG. 3 and is a plan view of a resonator according to a sixth exemplary embodiment in a state in which an upper substrate is detached.

FIG. 13 is a view illustrating an example of a plan view of the resonator 10 in the embodiment. Hereinafter, points of the detail configuration of the resonance device 1 in the embodiment, which are different from the third embodiment, will be mainly described.

In the exemplary embodiment, the base portion 15 has, on the rear end, two shorter sides 15e and 15f instead of the longer side 15b in the third embodiment. That is to say, the base portion 15 in the embodiment has the longer side 15a and the shorter sides 15c to 15f and has a pentagonal shape which is line symmetrical with respect to a perpendicular bisector of the longer side 15a when seen from the above. In this embodiment, each of the holding arms 18 is connected to the shorter sides 15e and 15f, respectively, as regions at the rear end side of the base portion 15. Other configurations and effects are the same as those in the third embodiment.

Seventh Embodiment

Figure 14:
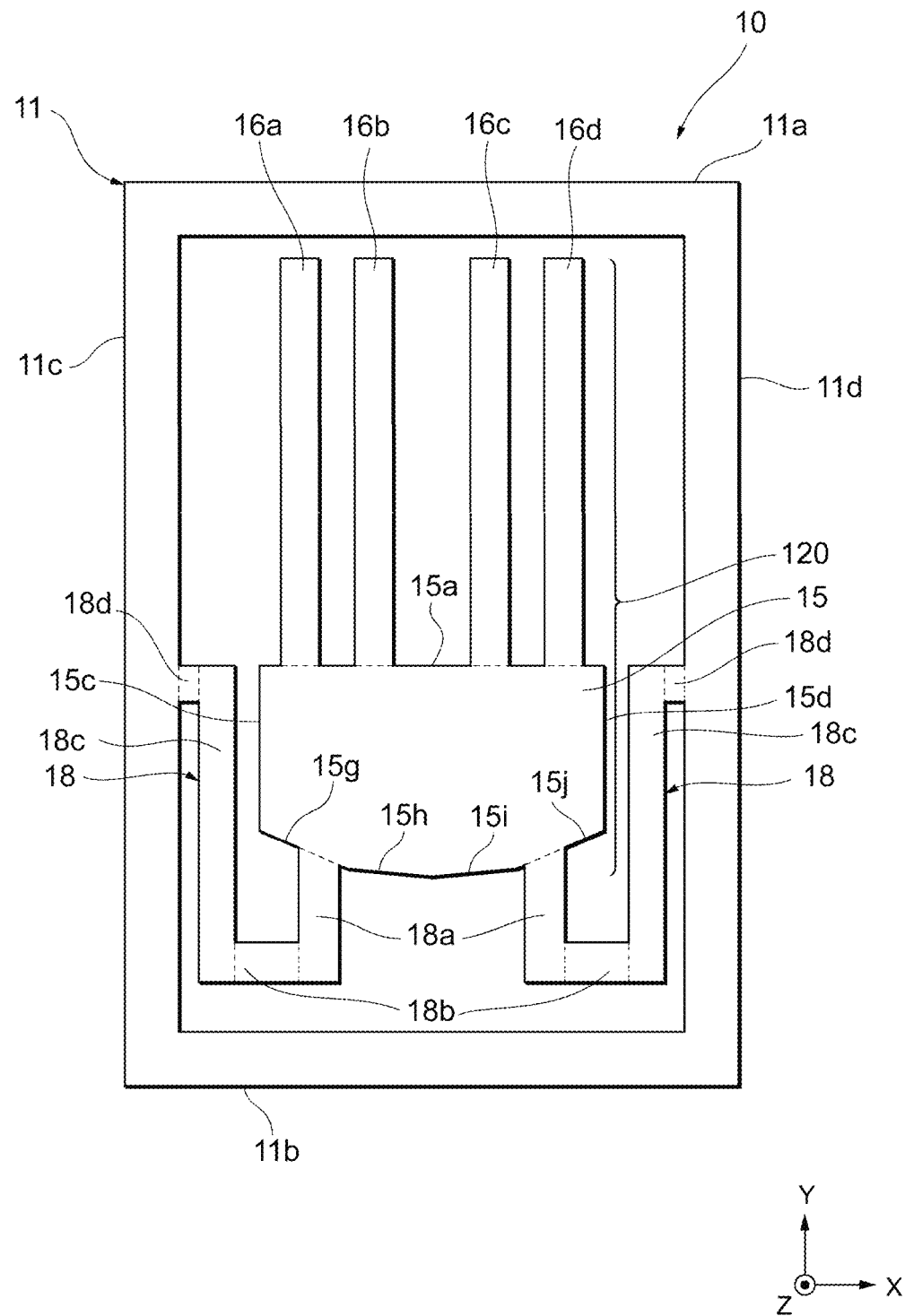
FIG. 14 corresponds to FIG. 3 and is a plan view of a resonator according to a seventh exemplary embodiment in a state in which an upper substrate is detached.

FIG. 14 is a view illustrating an example of a plan view of the resonator 10 in the embodiment. Hereinafter, points of the detail configuration of the resonance device 1 in the embodiment, which are different from the third embodiment, will be mainly described.

In the exemplary embodiment, the base portion 15 has, on the rear end, four shorter sides 15g to 15j instead of the longer side 15b in the third embodiment. That is to say, the rear end of the base portion 15 in the embodiment has a substantially circular arc shape when seen from the above. In the embodiment, each of the holding arms 18 is connected to the shorter sides 15g and 15j, respectively, as regions at the rear end side of the base portion 15. Other configurations and effects are the same as those in the third embodiment.

Eighth Embodiment

Figure 15:
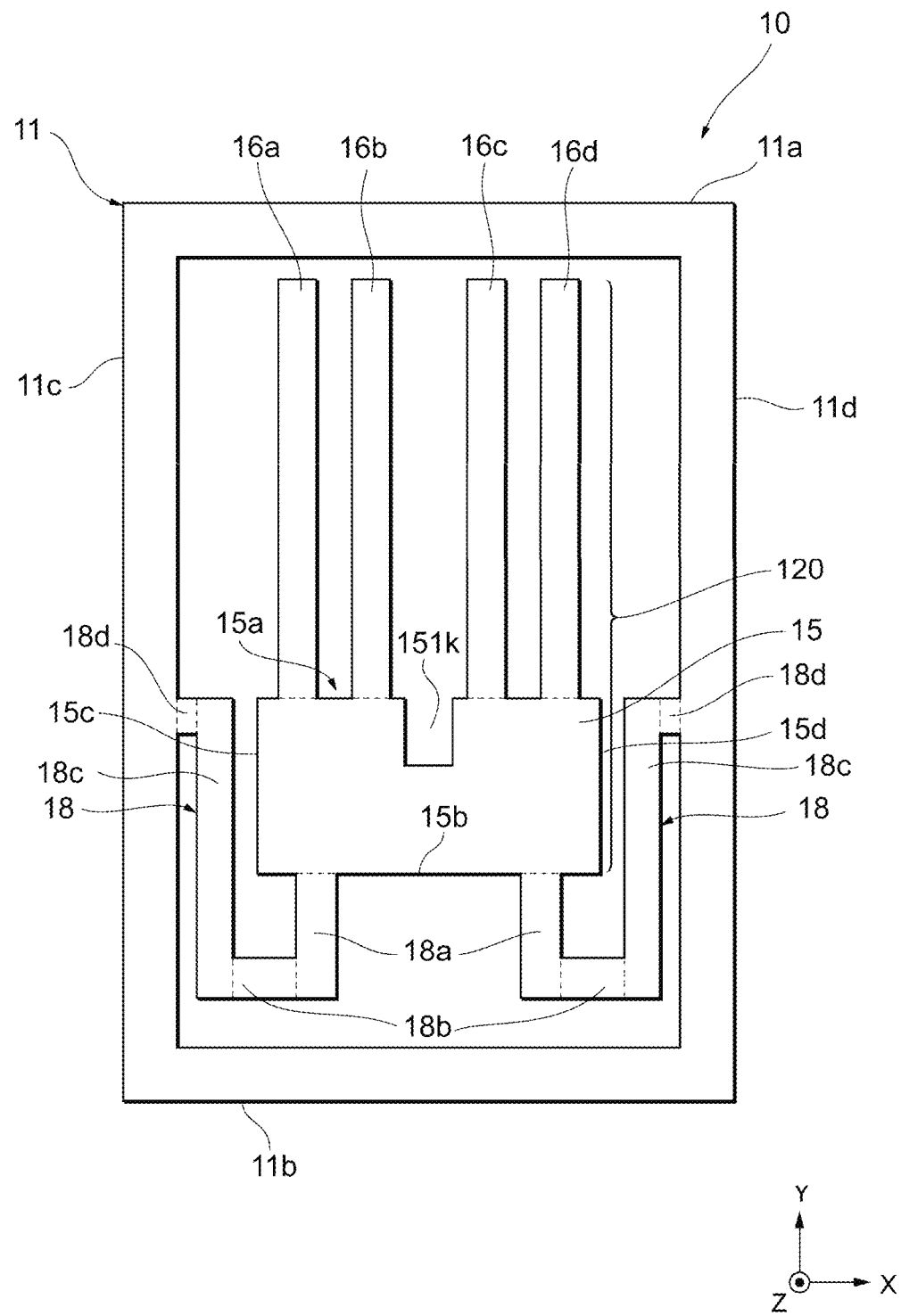
FIG. 15 corresponds to FIG. 3 and is a plan view of a resonator according to an eighth exemplary embodiment in a state in which an upper substrate is detached.

FIG. 15 is a view illustrating an example of a plan view of the resonator 10 in the embodiment. Hereinafter, points of the detail configuration of the resonance device 1 in the embodiment, which are different from the third embodiment, will be mainly described.

In the exemplary embodiment, the base portion 15 has, on the front end, a recess portion 151k that is formed between a connection place thereof to the vibration arm 16b and a connection place thereof to the vibration arm 16c. To be specific, in the embodiment, the longer side 15a as the front end extends in parallel with the longer side 15b to the connection place to the vibration arm 16b from the connection place to the shorter side 15c. The longer side 15a is bent to the longer side 15b side substantially perpendicularly, extends in parallel with the shorter side 15c, and is further bent to the shorter side 15d side substantially perpendicularly in the vicinity of the center of the shorter side 15c. After bending, the longer side 15a extends in parallel with the longer side 15b again, and is further bent to the vibration arm 16c side substantially perpendicularly in the vicinity of an extension line of the vibration arm 16c. Moreover, the longer side 15a is bent to the shorter side 15d side substantially perpendicularly at a connection place to the vibration arm 16c, and extends to the connection place to the shorter side 15d. In this manner, the recess portion 151k is formed on the front end of the base portion 15. Other configurations and effects are the same as those in the third embodiment.

The respective embodiments described above are intended to facilitate understanding of the present invention and are not intended to make the present invention be interpreted in a limiting manner. The exemplary embodiments can be changed and improved without departing from the gist thereof and encompasses equivalents thereof. That is to say, those provided by appropriately adding design changes to the respective embodiments by those skilled in the art are also encompassed in the scope of the invention as long as they have the characteristics of the present invention. For example, elements included in the respective embodiments, and arrangements, materials, conditions, shapes, sizes, and the like thereof are not limited to the described ones and can be appropriately changed. Although, for example, the holding arms 18 are bent equal to or more than twice in the described embodiments, the holding arms 18 are not limited to have the configuration. The holding arms 18 may be configured to connect the longer side 15b of the base portion 15 and the frame body 11b without being bent, for example. The holding arms 18 may be configured to connect the longer side 15b of the base portion 15 and the frame body 11c or 11d while being bent only once, for example. In this case, the resonance device 1 can be reduced in size. It is needless to say that the respective embodiments as described above are exemplary and partial replacement or combination of components in different embodiments can be made and those provided thereby are encompassed in the present invention as long as they have the characteristics of the present invention.

REFERENCE SIGNS LIST

1 RESONANCE DEVICE
10 RESONATOR
13 UPPER LID
14 LOWER LID
11 HOLDING PORTION
11a to d FRAME BODY
18 HOLDING ARM
18a to e ARM
120 VIBRATION PORTION
15 BASE PORTION
15a, 15b LONGER SIDE
15c SHORTER SIDE
16a to d VIBRATION ARM
22 SiO$_2$ FILM
23 Si LAYER
24 PIEZOELECTRIC THIN FILM
25, 26 METAL LAYER

The invention claimed is:

1. A resonator comprising:
a vibration portion having a base with a front end and a rear end opposing the front end and a plurality of vibration arms that each has a fixed end connected to the front end of the base, such that the plurality of vibration arms extend away from the front end of the base;
a frame that at least partially surrounds a periphery of the vibration portion; and
at least one holding arm disposed between the vibration portion and the frame, the at least one holding arm having a first end coupled to the rear end of the base and a second end coupled to the frame closer to the front end of the base than the rear end of the base, wherein the first end of the at least one holding arm extends from the rear end of the base and in a direction backwards from a direction that the plurality of vibration arms extend from the front end of the base.

2. The resonator according to claim 1, wherein the frame includes a first fixing portion that faces open ends of the plurality of vibration arms that are opposite the fixed ends and a second fixing portion that faces the plurality of vibration arms along a direction in which the plurality of vibration arms extend.

3. The resonator according to claim 2, wherein the second end of the at least one holding arm is connected to one of the first and second fixing portions.

4. The resonator according to claim 1, wherein the first end of the at least one holding arm is coupled to a region of the base to minimize displacement of vibration of the base during excitation of the resonator.

5. The resonator according to claim 3, wherein in the first end of the at least one holding arm, a center of an end surface of the first end is connected to a vibration arm side that is connected to the base to be adjacent to a first vibration arm of the plurality of vibration arms connected to the base at an outermost side of the front end of the base relative to the plurality of vibration arms.

6. The resonator according to claim 3, wherein the first end of the at least one holding arm is coupled at a position on the base, such that a distance to a center of an end surface of the front end of the base from a center of an end surface of the first end of the at least one holding arm is equal to or less than 60% of a length of half of a straight line having a maximum length among straight lines that pass through a surface of the base and are in parallel with the front end of the base.

7. The resonator according to claim 1, wherein the at least one holding arm comprises a pair of holding arms symmetrically disposed on opposing sides of the base and the plurality of vibration arms.

8. The resonator according to claim 7, wherein respective first ends of the pair of holding arms extend in a direction parallel to the plurality of vibration arms.

9. The resonator according to claim 8, wherein the pair of holding arms each have a length greater than a combined length of the base from the front end to the rear end and one of the plurality vibration arms.

10. The resonator according to claim 1, wherein the at least one holding arm extends from the frame and in a direction parallel to a lengthwise direction of the plurality of vibration arms and past the rear end of the base.

11. The resonator according to claim 1, wherein the plurality of vibration arms includes four vibration arms with a space between an inner two vibration arms being greater than a space between one of the inner two vibration arms and an adjacent outer vibration arm.

12. The resonator according to claim 1, wherein the second end of the at least one holding arm is coupled to a side of the frame at a position directly facing a side of the front end of the base.

13. The resonator according to claim 1, wherein the second end of the at least one holding arm is coupled to the frame and is directly between the frame and an open end of at least one of the plurality of vibration arms.

14. The resonator according to claim 1, wherein each of the plurality of vibration arms includes a weight disposed at a respective free end of the respective vibration arm opposite the fixed end.

15. The resonator according to claim 1, wherein the base comprises a rectangular shape with the front end opposing the rear end, such that the at least one holding arm extends in a direction parallel to a side of the base and is disposed between the side of the base and the frame.

16. A resonance device comprising the resonator according to claim 1.

17. A resonator comprising:
a vibration portion having a base with opposing first and second ends end and a plurality of vibration arms extending from the first end away from the front end of the base;
a frame that at least partially surrounds a periphery of the vibration portion; and
a pair of holding arms coupling the frame to the vibration portion,
wherein the pair of holding arms extend from a side of the frame that faces respective open ends of each of the plurality of vibration arms and in a direction in parallel to the plurality of vibration arms so as to be disposed between respective sides of the base and the frame,
wherein the pair of holding arms are coupled to the second end of the base of the vibration portion, and
wherein the pair of holding arms extend from the second end of the base that is opposite of the first end and in a direction different than a direction that the plurality of vibration arms extend from the first end of the base.

18. The resonator according to claim 17, wherein each of the pair of holding arms comprises a first end coupled to the second end of the base and a second end coupled to the frame at a position closer to the first end of the base than the second end of the base.

19. The resonator according to claim 18,
wherein the frame includes a first fixing portion that faces the open ends of the plurality of vibration arms and a pair of second fixing portions that each face the plurality of vibration arms along a direction in which the plurality of vibration arms extend, with the plurality of vibration arms disposed between the pair of second fixing portions, and
wherein the second end of each of the pair of holding arms is connected to either the first fixing portion or one second fixing portion of the pair of second fixing portions of the frame, respectively.

20. A resonator comprising:
a vibration portion having a base with a front end and a rear end opposing the front end and a plurality of vibration arms that each has a fixed end connected to the front end of the base, such that the plurality of vibration arms extend away from the front end of the base;
a frame that at least partially surrounds a periphery of the vibration portion; and
at least one holding arm disposed between the vibration portion and the frame, the at least one holding arm having a first end coupled to the base and a second end coupled to the frame closer to the front end of the base than the rear end of the base,
wherein the at least one holding arm extends from the frame and in a direction parallel to a lengthwise direction of the plurality of vibration arms and past the rear end of the base, and wherein the at least one holding arm has a first length that extends parallel to the plurality of vibration arms, a second length that extends in a direction perpendicular to the first length, and a third length that extends in a direction parallel to the first length and is coupled to the rear end of the base.

\* \* \* \* \*